Figure 1:
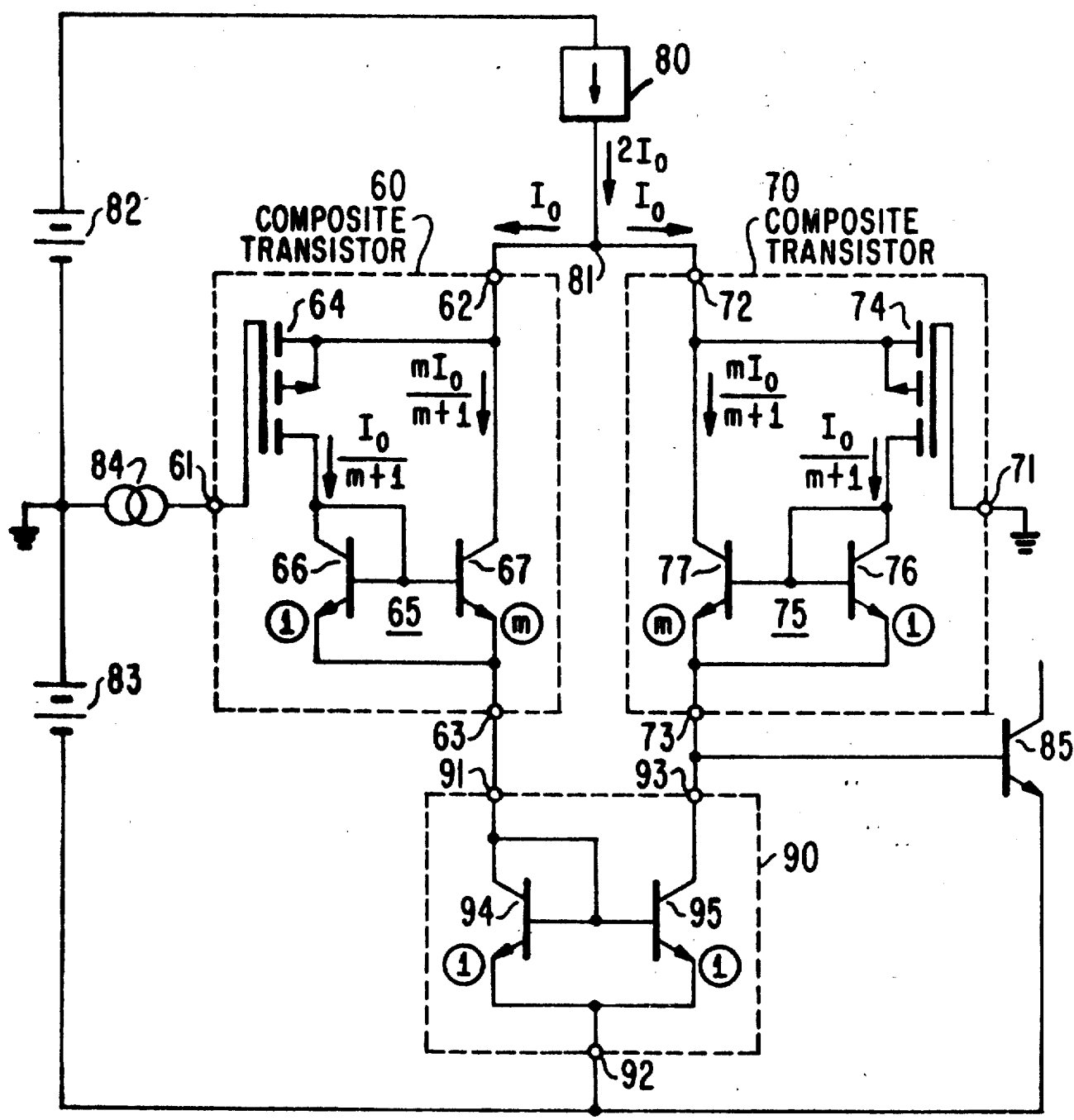

United States Patent [19]

Schade, Jr.

[11] 4,060,770
[45] Nov. 29, 1977

[54] DIFFERENTIAL AMPLIFIER

[75] Inventor: Otto Heinrich Schade, Jr., North Caldwell, N.J.

[73] Assignee: RCA Corporation, New York, N.Y.

[21] Appl. No.: 744,408

[22] Filed: Nov. 23, 1976

Related U.S. Application Data

[62] Division of Ser. No. 644,821, Dec. 29, 1975.

[30] Foreign Application Priority Data

Feb. 24, 1975 United Kingdom ............... 07659/75

[51] Int. Cl.$^2$ ........................................... H03F 3/45
[52] U.S. Cl. ..................................... 330/253; 330/261
[58] Field of Search ................... 330/17, 19, 22, 30 D, 330/35

[56] References Cited

U.S. PATENT DOCUMENTS

| 3,813,595 | 5/1974 | Sheng | 330/19 X |
| 3,852,679 | 12/1974 | Schade, Jr. | 330/30 D |

Primary Examiner—Lawrence J. Dahl
Attorney, Agent, or Firm—H. Christoffersen; A. L. Limberg

[57] ABSTRACT

A differential amplifier suited for use in operational amplifiers employing both FET's and junction transistors has a superior gain-bandwidth product for given input offset specification. Source-coupled FET's accept input signals at their gate electrodes. Each FET is included in a composite transistor device together with a direct coupled, inverting, current amplifier having an input terminal to which the drain electrode of the FET is coupled and having an output terminal coupled to the source electrode of the FET.

3 Claims, 2 Drawing Figures

DIFFERENTIAL AMPLIFIER

This application is a divisional application based on U.S. Pat. Application Ser. No. 644,821 filed Dec. 29, 1975 and entitled "AMPLIFIER CIRCUITS", the specification and drawing of which are included in their entirety by reference in this disclosure.

The present invention relates to differential amplifiers which employ both field effect transistors (FET's) and bipolar transistors and are suited to construction in integrated circuit form.

Such differential amplifiers are useful, for example, as the input stage of an integrated-circuit operational amplifier. Source-coupled FET's in the longtailed pair configuration have been used in such differential amplifiers as described in U.S. Pat. No. 3,852,679 issued Dec. 3, 1974 to Otto H. Schade, Jr.; entitled "CURRENT MIRROR AMPLIFIERS"; and assigned to RCA Corporation. A basic reason for using such configurations is that the FET's have extremely high input impedances and input offset current errors are virtually eliminated. In integrated-circuit operational amplifiers employing such differential amplifiers as their input stages, the constraint upon bandwidth has often been imposed by the input stages. In such an input stage, a dominant time constant may be established by the source (electrode) impedances of the FET's equal to the reciprocals of their transconductances ($g_m$'s), and their source-electrode-to-signal-ground capacitances (C's). That is, there is a figure of merit $g_m/C$ which governs the gain-bandwidth product of the entire operational amplifier.

The traditional way of increasing the $g_m$ of long-tailed pair transistors, so wide bandwidth can be obtained, is to increase the level of the currents through the transistors. However, such current level increase increases the input offset error potential appearing between the gate electrodes of source-coupled FET's. In this regard, the long-tailed pair comprising source-coupled FET's differs from the long-tailed pair comprising emitter-coupled junction transistors. In the junction transistor, $g_m$ increases in direct proportion to emitter-current, so input offset error potential between the base electrodes of the emitter-coupled transistors remains substantially constant with increased level of combined emitter currents. In the FET, however, $g_m$ increases at a less rapid rate than increased source current, so larger and larger input offset error potential is required between the gate electrodes of the source-coupled FET's, as the level of their combined source currents is increased, in order to support the mismatch in their drain currents imposed by their relative geometries being mismatched or by the ensuing circuitry. The operational-amplifier designer has been forced in many instances to accept as less-than satisfactory compromise between wide bandwidth and low input offset potential error in prior art designs using FET input stages.

To avoid having to accept increased input offset potential error, it is, then, desirable to increase the $g_m/C$ figure of merit without having to increase the current level in the long-tailed pair. Such improvement requires either: (a) the $g_m$ of each FET to be increased without attendant increase in its source-to-electrode-signal-ground capacitance or (b) the source-electrode-to-signal-ground capacitance of each FET to be decreased without attendant decrease in its $g_m$. Unfortunately, this is more easily said than done, because the $g_m$ of an FET is proportional to its channel width and thus its area on the integrated circuit die and because the effective source-electrode-to-signal-ground capacitance is proportional to the area of the FET on the integrated circuit. This latter comes about because the FET substrate is an isolation tub in the integrated-circuit substrate, and the resultant FET-substrate-to-integrated-circuit-substrate capacitance is usually the dominant portion of the effective source-electrode-to-signal-ground-capacitance of the FET.

The present invention is directed to a circuit technique for obtaining better $g_mC$ figures of merit in the source-coupled FET differential amplifier without having to resort to a new device technology. The effective $g_m$ of each of the source-coupled FET's is multiplied up in a composite transistor comprising the FET and a direct-coupled inverting current amplifier with input and output terminals respectively connected to the FET drain electrode and to the FET source electrode. This is done without the attendantproportional increase in effective source-electrode-to-signal-ground capacitance of the FET, so the $g_m/C$ figure of merit is improved.

Figure 2:
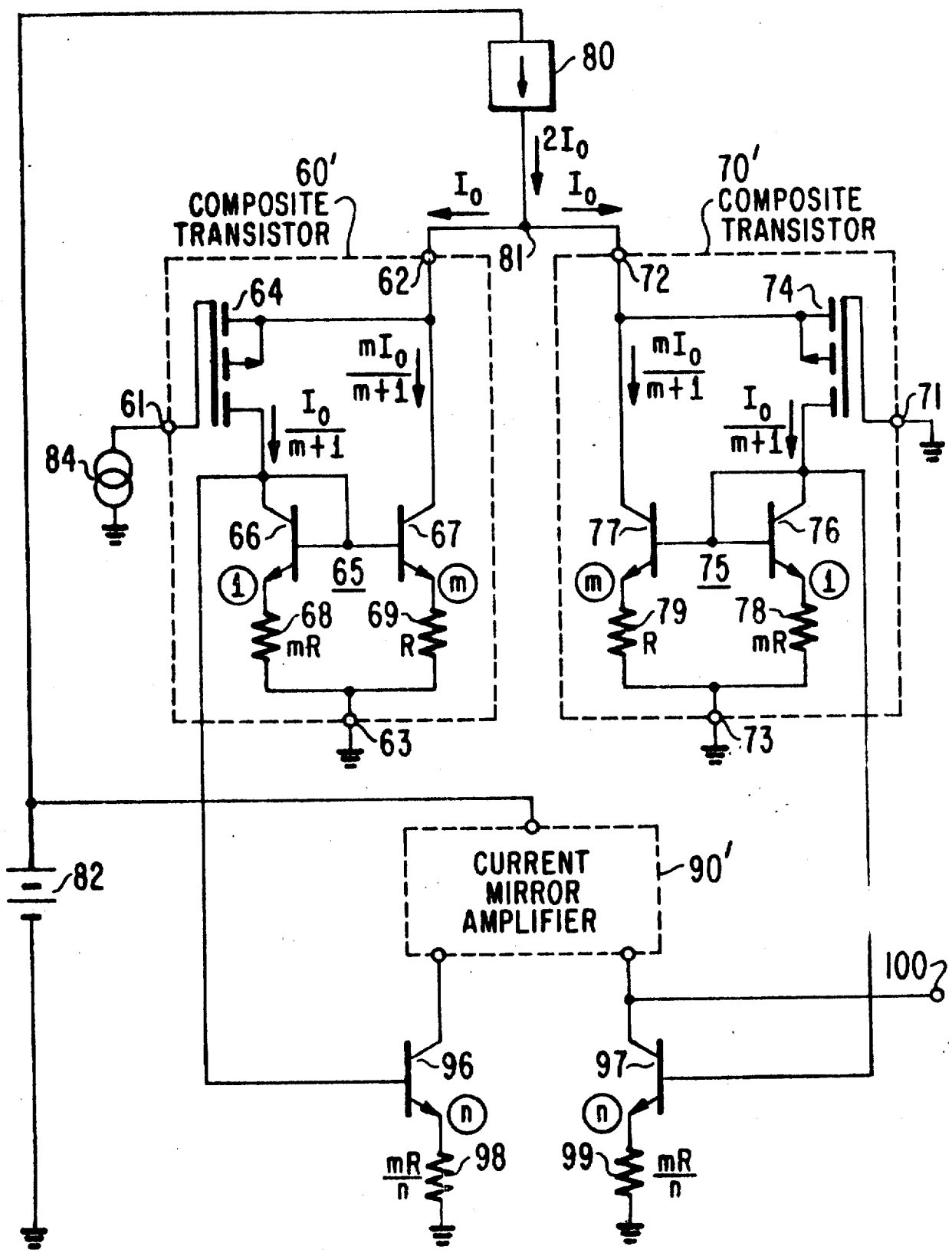

In the drawing:

FIG. 1 is a schematic diagram, partially in block form, of a differential amplifier stage embodying the present invention, wherein the "source-coupled" composite transistor devices are used in "common-source amplifier configuration", with a current mirror amplifier used as active "drain" loads and as a balanced-to-single-ended-signal converter; and FIG. 2 is a schematic diagram, partially in block form, of a differential amplifier stage, wherein the composite transistor devices are coupled by current reflection to a current mirror amplifier used as a balanced-to-single-ended signal converter.

The FIG. 1 differential amplifier stage is suited for use as the input stage of an operational amplifier. Composite transistors 60 and 70, each consisting of an amplifier circuit as shown in FIG. 3 of Pat. application Ser. No. 644,821 are connected in long-tailed-pair configuration with each other. The equivalent source electrodes of composite transistors 60 and 70 are 62 and 72, respectively, connected to a node 81, which receives constant current $2I_O$ from source 80. This $2I_O$ current splits equally insofar as quiescent currents to terminals 62 and 72 are concerned, presuming terminals 61 and 71 serving as the equivalent gate electrodes of composite transistors 60 and 70, respectively, to be at equal quiescent potentials. In FIG. 1, these equals quiescent potentials are shown as being ground reference potential to which positive and negative operating potential supplies 82 and 83 are referred. A source 84 of input signal superimposes an input signal potential on the quiescent potential applied to terminal 61. The equivalent drain electrodes of composite transistors 60 and 70 are at terminals 63 and 73, respectively.

A CMA 90, comprising transistors 94 and 95, has an input terminal 91 to which terminal 63 is connected, a common terminal 92 shown connected to receive a negative supply potential from battery 83, and an output terminal 93 to which terminal 73 is connected. CMA 90 provides an - active "drain" load for each of the composite transistors 60 and 70 and operates as a balanced-to-single-ended signal converter, differentially combining the "drain" currents of composite transistors 60 and 70 for applicaton to the input electrode of transistor 85 in a succeeding amplifier. CMA 90 and succeeding amplifier transistor amplifier 85 are shown in their simplest known configurations and, as will be appreciated by one skilled in the art, may be replaced with more complex circuits of the same general types. Battery 82 provides a positive supply potential to which source 80 is connected to complete a return path for the current it supplies to node 81.

Composite transistor 60 comprises FET 64 and CMA 65, CMA 65 being used to multiply the transconductance of FET 64 by $(m+1)$. So, only $1/(m+1)$ times $I_O$ flows as quiescent current through the channel of FET 64, the $m/(m+1)$ times $I_O$, remainder of $I_O$ flowing through the output circuit of CMA 65. Similar quiescent conditions obtain in composite transistor 70, due to the combined actions of field-effect transistor 74 and and CMA 75.

This reduction of quiescent source-to-drain current in FET 64, as compared to that of the simple FET which composite transistor 60 replaces, results in a lower component of input offset potential error for a given value of $I_O$ as contributed by composite transistor 60. Now, if an FET has sufficient source-to-drain current to operate in the square-law portion of its $g_m$ versus source-to-drain current $I_S$ characteristic, the $(m+1)$ times reduction in $I_S$ will be accompanied by only a $\sqrt{(m+1)}$ reduction in its $g_m$. But, since the drain current of FET 64, responsive to input signal potential, is multiplied (i m+1) times to appear at "drain" terminal 63 of composite transistor 60, a gain of $\sqrt{(m+1)}$ in the overall $g_m$ of the composite transistor 60 will be achieved. So, the $g_m/C$ figure of merit for the FIG. 13 differential amplifier stage will be greater than that for a conventional long-tailed pair configuration which uses just two simple source-coupled FET's, if only the capacitance between node 81 and signal ground can be increased by less than an $(m+1)$ factor due to the presence of the collector-to-signal ground capacitances of transistors 67 and 77.

Fortunately, this is easily accomplished in monolithic silicon circuits by making NPN transistors 67 and 77 with standard vertical-structures in separate isolation tubs of N doped material over a P+ substrate. The isolation tubs can be kept quite small in area despite transistors 67 and 77 having substantial collector-to-emitter current handling capability. Therefore, their isolation-tub-to-P+-substrate capacitances, which are a components of the node-81-to-signal-ground capacitance by virtue of the P+ substrate being biased to the negative supply potential and thus being at signal ground, are kept small.

Even tighter control of the increase in capacitance between node 81 and signal ground can be achieved by going to a composite structure for the FET 64 and junction transistor 67 (and, of course, for FET 74 and junction transistor 77). The collector region of the junction transistor can be the same as the N substrate of the FET; and, insofar as the collector electrode of the junction transistor is concerned, the N+ region required for ohmic contact to the collector region and the metallization making the ohmic contact can be subsumed into the corresponding parts associated with the substrate electrode of the FET. Further, the base and drain regions of the junction transistor and the FET can be in common. So, the junction transistor can be substantially incorporated into the FET structure without increase in area taken up on the integrated circuit die except for a small N+ region in the shared base and drain region to serve as the emitter region of the junction transistor.

Even at source-to-drain current levels substantially lower than those needed to obtain square law operation of FET's 64 and 74, their $g_m$'s are not reduced as quickly as the current levels are reduced. So substantial benefit is still obtained from multiplying up the effective $g_m$'s of the FET's 64 and 74 at these current levels also.

Consider now why it is preferable to use self-biased transistors 66 and 76 in parallel with the base-emitter junctions of transistors, since it is apparent from the foregoing instruction that their omission would result in improved $g_m/C$ ratio because junction transistors 67 and 77 of themselves would be current amplifiers and indeed ones with higher current gain. The use of the self-biased transistors 66 and 76, or other current amplifier arrangements which have their current gains determined by the proportions between the transconductances of their component transistors, to stabilize the ratio of the source-to-drain currents of the FET's to the collector currents of junction transistors 67 and 77 is undertaken to reduce the input offset potential error between terminals 61 and 71 arising from dissimilarity of the source-to-drain currents in the FET's 64 and 74. The matching of the current gains of these current amplifier configurations tends to be substantially better on a statistical basis than the matching of the common-emitter forward current gains of single transistors over a production run of integrated circuits. So the use of these current amplifiers, such as 65 and 75, instead of simple transistors provides better matched source-to-drain currents for FET's 64 and 74 and thus lower input offset potential error between terminals 61 and 71. The skilled integrated circuit designer will be aware of many alternative current amplifier configurations to 65 and 75 in which current gain is accurately determined by the proportions between the transconductances of component transistors, and most known ways of improving the accuracy of current gain and the matching of the current gains of a pair of current amplifiers of this type can be advantageously employed in connection with the present invention.

Also, as known, the current mirror amplifier 90 can be arranged to have its current gain trimmed. If the FIG. 13 input stage be incorporated into an operational amplifier which is included in a degenerative feedback loop, the trimming of the current gain of the current mirror amplifier can then be used to null the input offset potential error appearing between terminals 61 and 71.

Yet another purpose for restraining an m-value to less than the common emitter forward current gains of NPN transistors is that excessive "input" impedance at the base electrodes of 67 and 77 will introduce an additional pole in the useful passband, due to capacitance at this node.

It is desirable to operate an operational amplifier with a single power supply. In FIG. 1, if battery 83 is replaced by direct connection, the quiescent drain-to-source potential is reduced more than is desirable. Where low threshold potential MOSFET's are used, it is likely that the two $V_{BE}$ junction offset potentials appearing across self-biased transistors 94 and 66 plus the drain-to-source saturation potential of FET 64 will, with temperature excursion, exceed the source-to-gate potential of FET 64 and cut off its conduction.

FIG. 2 shows a more practical circuit for single power supply operation. Composite transistors 60' and 70' are similar to the composite transistors 60 and 70 of FIG. 13 except transistors 66, 67, 76 and 77 are provided emitter degeneration resistors 68, 69, 78 and 79, respectively, and terminals 63 and 73 are connected to reference potential (ground). The potential drops across resistors 68, 69, 78 and 79 are kept to less than half a volt, and the reduction of quiescent drain-to-source potentials for FET's 64 and 74 is less severe with the removal of current mirror amplifier 90. The conductances of emitter degeneration resistors 68, 69, 78 and 79 are in the same relative proportions as the transconductances of transistors 66, 67, 76 and 77, respectively, so the presence of the emitter degeneration resistors does not affect the nominal current gains of CMA's 65 and 75.

CMA 90' is of complementary conductivity type to the CMA 90 it replaces and may, for example, be of the type described in Published U.S. Patent Application No. B 387,171 published Jan. 28, 1975 in the name of O. H. Schade, Jr., and entitled CURRENT AMPLIFIER. CMA 90' provides active collector loads to transistors 96 and 97 and operates as a balanced-to-single-ended signal converter to differentially combine the collector current variations of transistors 96 and 97 to provide an output signal current at terminal 100. Transistor 96 is arranged so its base-emitter circuit has an impedance m/n times that of transistor 67 and is in parallel connection with those of transistors 66 and 67. Therefore, the collector current of transistor 96 is proportioned to that of transistor 67 by a ratio n/m, where n is the ratio of the base-emitter junction area of transistor 96 to that of transistor 66. Transistor 97 is similarly arranged with respect to transistors 76 and 77.

With $m = 4$, the FIG. 2 differential amplifier stage is calculated to provide an input offset potential error of only 4 millivolts at 7 MHz bandwidth or 8 millivolt at 28 MHz bandwidth. With $m = 9$, input offset potential error of only 4 millivolts at 11 MHz bandwidth or 8 millivolts at 48 MHz bandwidth should be possible. This is appreciably better than the 8 millivolt error at 7 MHz bandwidth obtainable with simple source-coupled FET's using the same device technology.

I claim:

1. A differential amplifier circuit comprising:
   first and second terminals for receiving input signals;
   third and fourth terminals for application of output signal to subsequent circuitry;
   first and second field effect transistors of a first conductivity type, each having source and drain and gate electrodes, their respective gate electrodes being respectively connected to said first terminal and to said second terminal;
   means for applying a bias current between said fourth terminal and an interconnection between the source electrodes of said first and said second field effect transistors;
   first and second and third current mirror amplifiers, each of a type including a respective pair of bipolar mirroring transistors of a second conductivity type complementary to said first conductivity type and having respective input and output and common terminals, the input and output terminals of said first current mirror amplifier being connected to the drain and source electrodes respectively of said first field effect transistor, the input and output terminals of said second current mirror amplifier being connected to the drain and source electrodes respectively of said second field effect transistor, the common terminal of said first current mirror amplifier being connected to the input terminal respectively of said third current mirror amplifier, the common terminal of said third current mirror amplifier being connected to said fourth terminal, and the output terminal of said third current mirror amplifier and the common terminal of said second current mirror amplifier being connected to said third terminal.

2. A differential amplifier comprising:
   first and second terminals for receiving input signals;
   third and fourth terminals for application of output signals to subsequent circuitry;
   first and second field effect transistors of a first conductivity type, each having source and drain and gate electrodes, their respective gate electrodes being connected to said first terminal and to said second terminal;
   first, second, third, fourth and fifth bipolar transistors of a second conductivity type complementary to said first conductivity type, each of said bipolar transistors having an emitter electrode connected to said fourth terminal, the collector electrode of said first bipolar transistor being galvanically connected to the drain electrode of said first field effect transistor and direct coupled to the base electrodes of said first and said second and said third bipolar transistors, the collector electrode of said bipolar transistor being galvanically connected to the source electrode of said first field effect transistor, the collector electrode of said third bipolar transistor being connected to said third terminal, the collector of said fourth bipolar transistor being galvanically connected to the drain electrode of said first field effect transistor and direct coupled to the base electrodes of said fourth and said fifth transistors, and the collector electrode of said fifth bipolar transistor being galvanically connected to the source electrode of said second field effect transistor;
   means for applying a bias current to an interconnection between the source electrodes of said first and said second field effect transistors; and
   means connected between said third and fourth terminals for operating said first, second and third bipolar transistors as a dual-output current mirror amplifier with an input terminal connected at the drain electrode of said first field effect transistor and its two output terminals connected respectively at the source electrode of said first field effect transistor and at said third terminal.

3. A differential amplifier circuit comprising:
   first and second terminals for receiving input signals;
   third and fourth terminals for application of output signal to subsequent circuitry;
   first and second field effect transistors of a first conductivity type, each having source and drain and gate electrodes, their respective gate electrodes being respectively connected to said first terminal and to said second terminal;
   first and second dual-output current mirror amplifiers, each of a type including bipolar mirroring transistors of a second conductivity type complementary to said first conductivity type and having input and first output and second output and common terminals, the input terminals of said first and said second current mirror amplifiers having the drain electrodes respectively of said first and of said second field-effect transistors respectively connected to them, the first output terminals of said first and said second current mirror amplifiers respectively connected to the source electrodes respectively of said first and of said second field effect transistors, the second output terminals of said first and said second current mirror amplifiers being respectively connected to said third terminal and to said fourth terminal; and means for applying a bias current to an interconnection between the source electrodes of said first and said second field effect transistors.

* * * * *

UNITED STATES PATENT AND TRADEMARK OFFICE
CERTIFICATE OF CORRECTION

PATENT NO. : 4,060,770

DATED : November 29, 1977

INVENTOR(S) : Otto Henrich Schade, Jr.

It is certified that error appears in the above—identified patent and that said Letters Patent are hereby corrected as shown below:

Delete sheets 1 and 2 of the drawings and substitute the attached sheets 1 and 2 of the drawings therefor.

Signed and Sealed this

Twenty-seventh Day of February 1979

[SEAL]

Attest:

RUTH C. MASON
*Attesting Officer*

DONALD W. BANNER
*Commissioner of Patents and Trademarks*